(12) United States Patent
Csicsay et al.

(10) Patent No.: US 9,281,544 B2
(45) Date of Patent: Mar. 8, 2016

(54) BATTERY PACK TEST SYSTEM

(71) Applicant: LG Chem, Ltd., Seoul (KR)

(72) Inventors: Chris Csicsay, Madison Heights, MI (US); Mohamed Alamgir, Rochester Hills, MI (US); Lori Reinke, Waterford, MI (US)

(73) Assignee: LG Chem, Ltd., Seoul (KR)

( * ) Notice: Subject to any disclaimer, the term of this patent is extended or adjusted under 35 U.S.C. 154(b) by 542 days.

(21) Appl. No.: 13/900,080

(22) Filed: May 22, 2013

(65) Prior Publication Data

US 2014/0346894 A1    Nov. 27, 2014

(51) Int. Cl.
| | |
|---|---|
| *H02H 7/18* | (2006.01) |
| *H01M 10/42* | (2006.01) |
| *H01M 10/48* | (2006.01) |
| *B60L 3/00* | (2006.01) |
| *B60L 3/04* | (2006.01) |
| *B60L 3/12* | (2006.01) |
| *B60L 11/18* | (2006.01) |
| *G01R 31/36* | (2006.01) |
| *H01M 10/44* | (2006.01) |

(52) U.S. Cl.
CPC ......... *H01M 10/4285* (2013.01); *B60L 3/0007* (2013.01); *B60L 3/0046* (2013.01); *B60L 3/04* (2013.01); *B60L 3/12* (2013.01); *B60L 11/1862* (2013.01); *B60L 11/1872* (2013.01); *H01M 10/48* (2013.01); *B60L 2240/36* (2013.01); *B60L 2240/545* (2013.01); *B60L 2240/547* (2013.01); *B60L 2240/662* (2013.01); *G01R 31/3627* (2013.01); *H01M 10/44* (2013.01); *H01M 2200/00* (2013.01); *Y10T 307/766* (2015.04)

(58) Field of Classification Search
CPC .............. H01M 10/4285; H01M 10/48; Y10T 307/766
USPC ........................................................ 307/116
See application file for complete search history.

(56) References Cited

U.S. PATENT DOCUMENTS

| | | | | |
|---|---|---|---|---|
| 2013/0307327 | A1* | 11/2013 | Auguet ................. | H01M 10/48 307/10.1 |
| 2014/0085094 | A1* | 3/2014 | Schumann ............ | H01M 10/48 340/363.1 |

FOREIGN PATENT DOCUMENTS

KR          101528811 B1 *  6/2015  ............ H01M 10/48

\* cited by examiner

*Primary Examiner* — Fritz M Fleming
(74) *Attorney, Agent, or Firm* — Buckert Patent & Trademark Law Firm, PC; John F. Buckert

(57) ABSTRACT

A battery pack test system is provided. The system includes a battery charging device that monitors an output voltage level of the vehicle battery pack. The system further includes a switch electrically coupled between an igniter and a voltage source. The system further includes a first video camera that generates a first plurality of images of an interior of the vehicle battery pack. The switch has a closed operational state at a first time in response to the output voltage level of a battery cell in the vehicle battery pack being greater than a threshold voltage level, to induce the igniter to generate a spark to generate a fire within an interior region of the vehicle battery pack.

17 Claims, 4 Drawing Sheets

BATTERY PACK TEST SYSTEM

BACKGROUND

A vehicle battery pack has been developed for hybrid electric vehicles or pure electric vehicles. The inventors herein have recognized a need for a battery pack test system that can perform a fire safety test to determine how long a vehicle battery pack can contain a fire therein.

SUMMARY

A battery pack test system for testing a vehicle battery pack in accordance with an exemplary embodiment is provided. The battery pack test system includes a first battery charging device configured to supply a first electrical current to the vehicle battery pack until the vehicle battery pack has a state-of-charge substantially equal to a desired state-of-charge. The battery pack test system further includes a second battery charging device configured to supply a second electrical current to a battery cell in the vehicle battery pack such that a state-of-charge of the battery cell is greater than a threshold state-of-charge, after the vehicle battery pack has the state-of-charge substantially equal to a desired state-of-charge. The battery pack test system further includes a data acquisition computer configured to measure an output voltage level of the battery cell. The battery pack test system further includes an electrically-actuated igniter disposed in the vehicle battery pack. The battery pack test system further includes a switch electrically coupled between the electrically-actuated igniter and a voltage source. The switch has a closed operational state in which a voltage is applied to the electrically-actuated igniter to induce the igniter to generate an electrical spark. The switch further includes an open operational state. The battery pack test system further includes a first video camera configured to generate a first plurality of images of an interior of the vehicle battery pack. The switch is transitioned from the open operational state to the closed operational state at a first time if either the output voltage level of the battery cell is greater than a threshold voltage level or the first plurality of images indicate gases escaping from the battery cell, to induce the igniter to generate the electrical spark to generate a fire within an interior region of the vehicle battery pack.

A battery pack test system for testing a vehicle battery pack in accordance with another exemplary embodiment is provided. The battery pack test system includes a first battery charging device configured to supply a first electrical current to the vehicle battery pack until the vehicle battery pack has a state-of-charge substantially equal to a desired state-of-charge. The first battery charging device is further configured to supply a second electrical current to a battery cell in the vehicle battery pack such that a state-of-charge of the battery cell is greater than a threshold state-of-charge, after supplying the first electrical current to the battery pack. The battery pack test system further includes a data acquisition computer configured to measure an output voltage level of the battery cell. The battery pack test system further includes an electrically-actuated igniter disposed in the vehicle battery pack. The battery pack test system further includes a switch electrically coupled between the electrically-actuated igniter and a voltage source. The switch has a closed operational state in which a voltage is applied to the electrically-actuated igniter to induce the igniter to generate an electrical spark. The switch further includes an open operational state. The battery pack test system further includes a first video camera configured to generate a first plurality of images of an interior of the vehicle battery pack. The switch is transitioned from the open operational state to the closed operational state at a first time if either the output voltage level of the battery cell is greater than a threshold voltage level or the first plurality of images indicate gases escaping from the battery cell, to induce the igniter to generate the electrical spark to generate a fire within an interior region of the battery pack.

DETAILED DESCRIPTION

Figure 1:
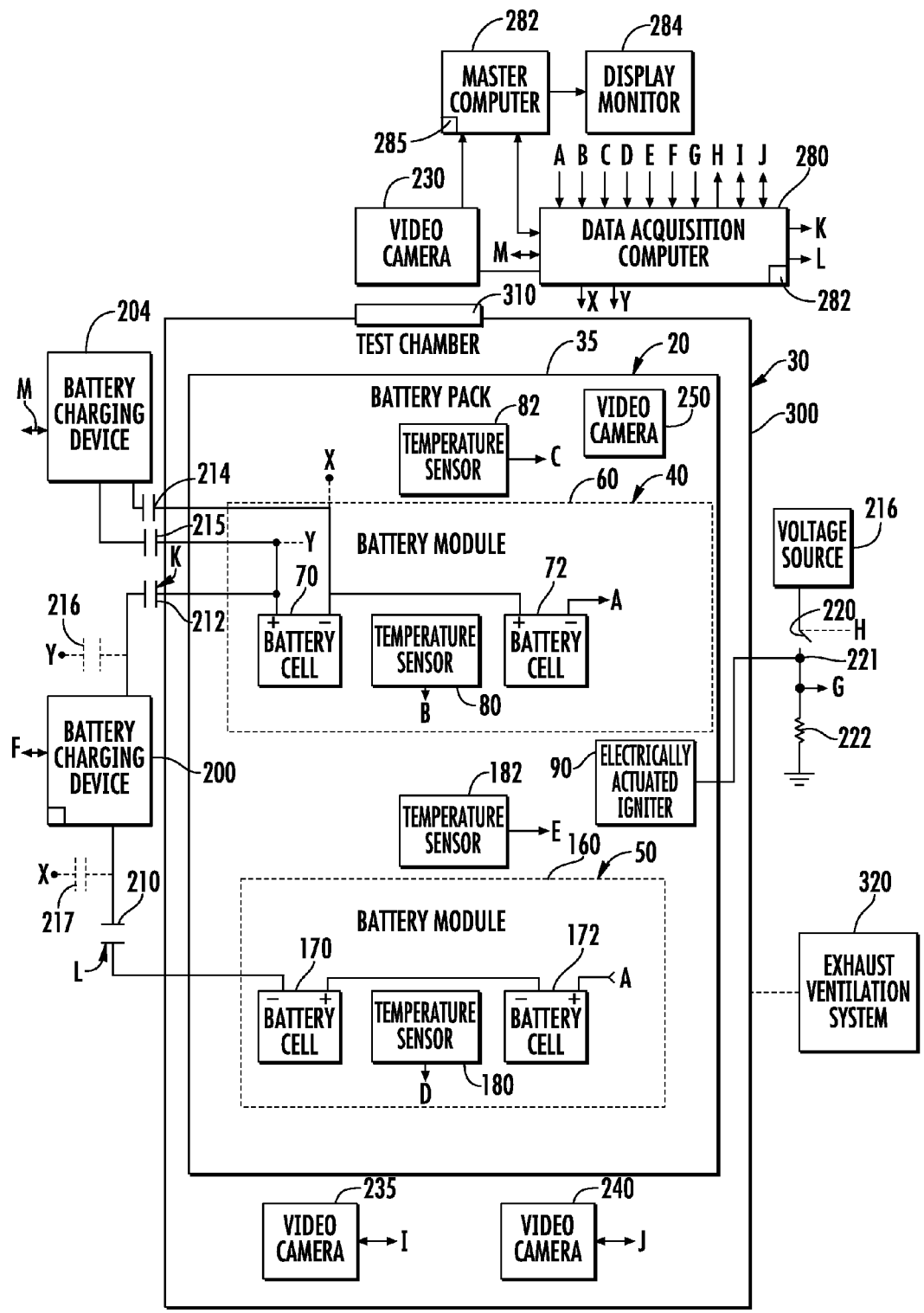
FIG. 1 is a schematic of a battery pack test system in accordance with an exemplary embodiment.
Figure 2:
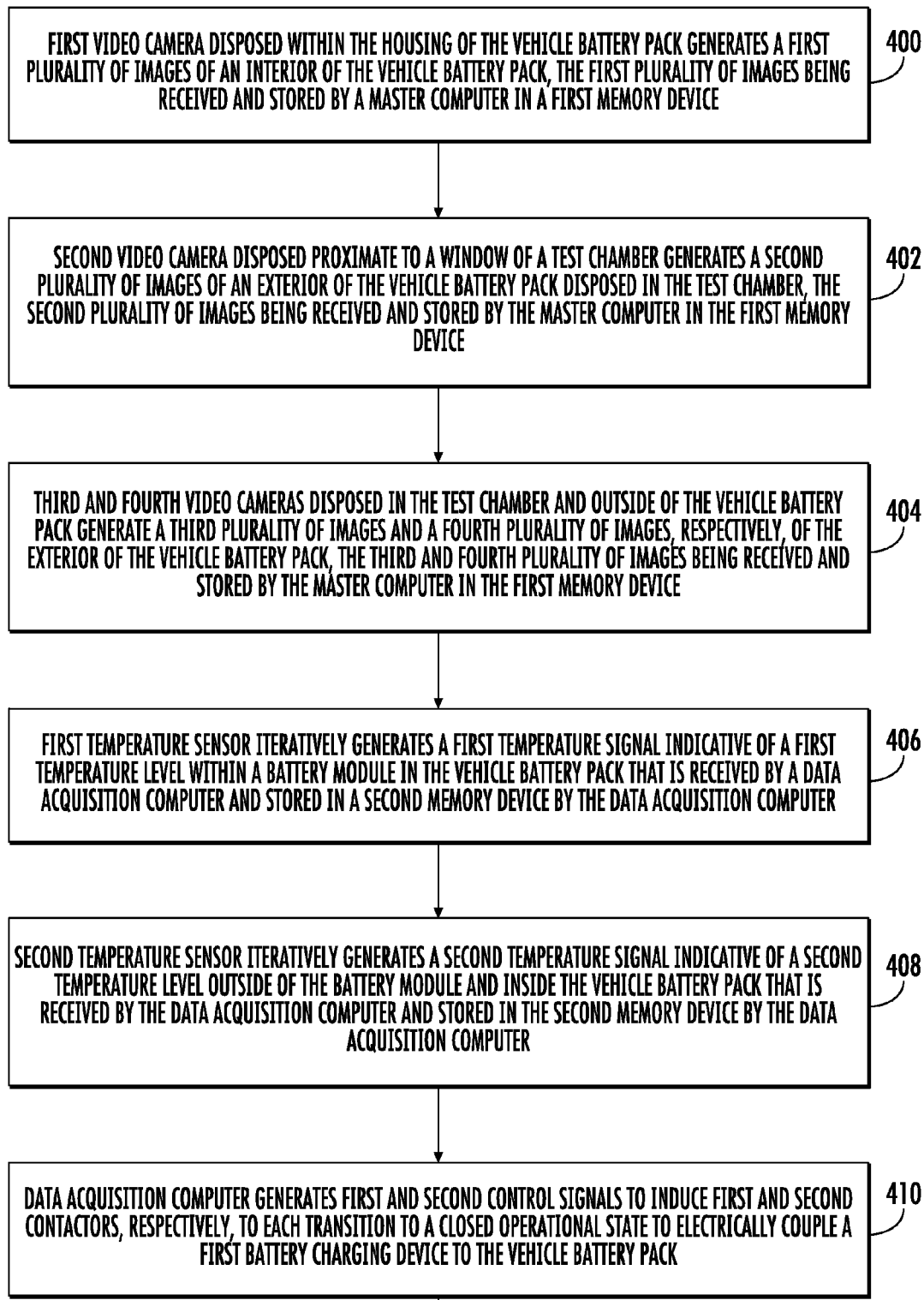
FIGS. 2-4 are a flowchart of a method for performing a fire safety test associated with a vehicle battery pack in accordance with another exemplary embodiment.
Figure 3:
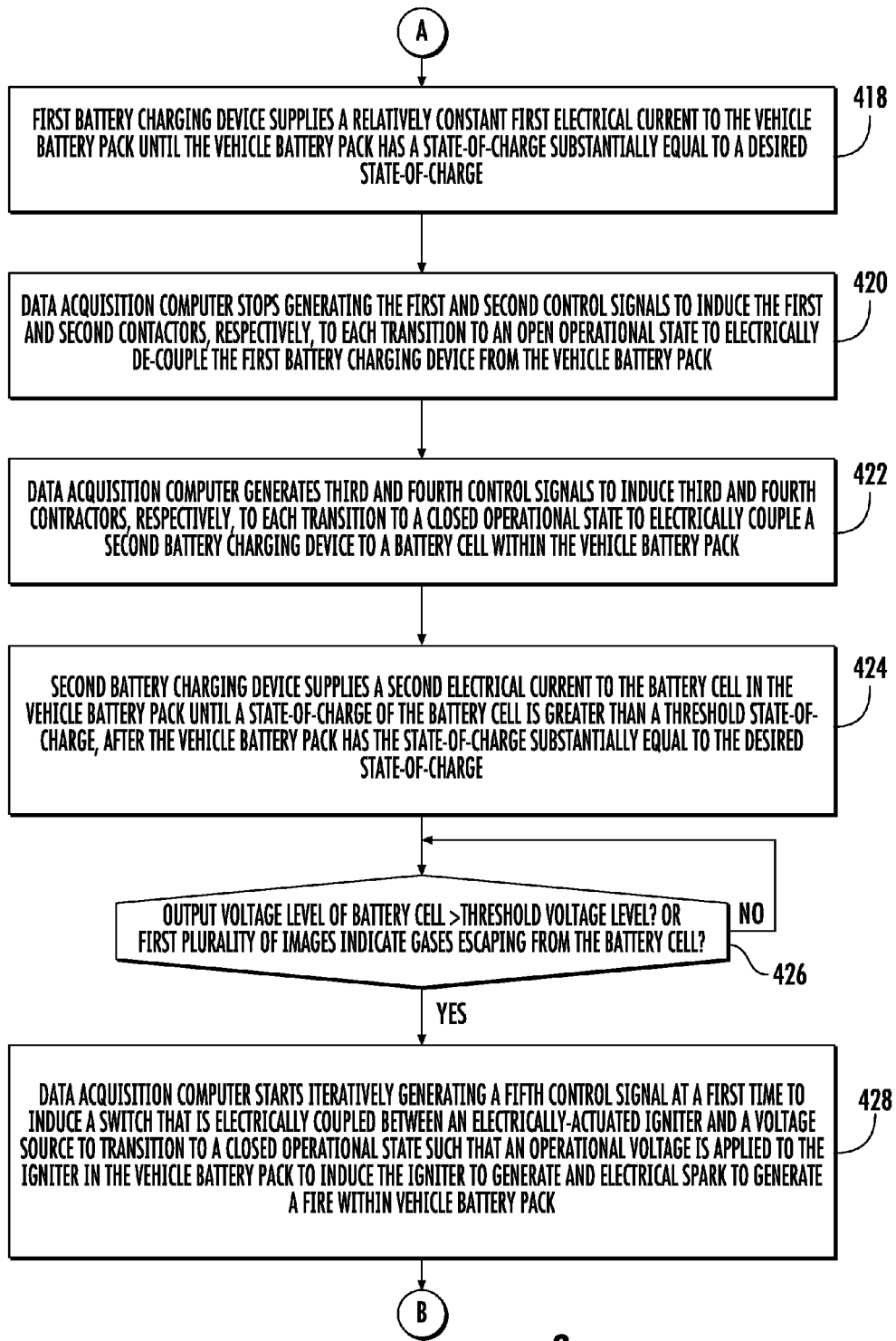
Figure 4:
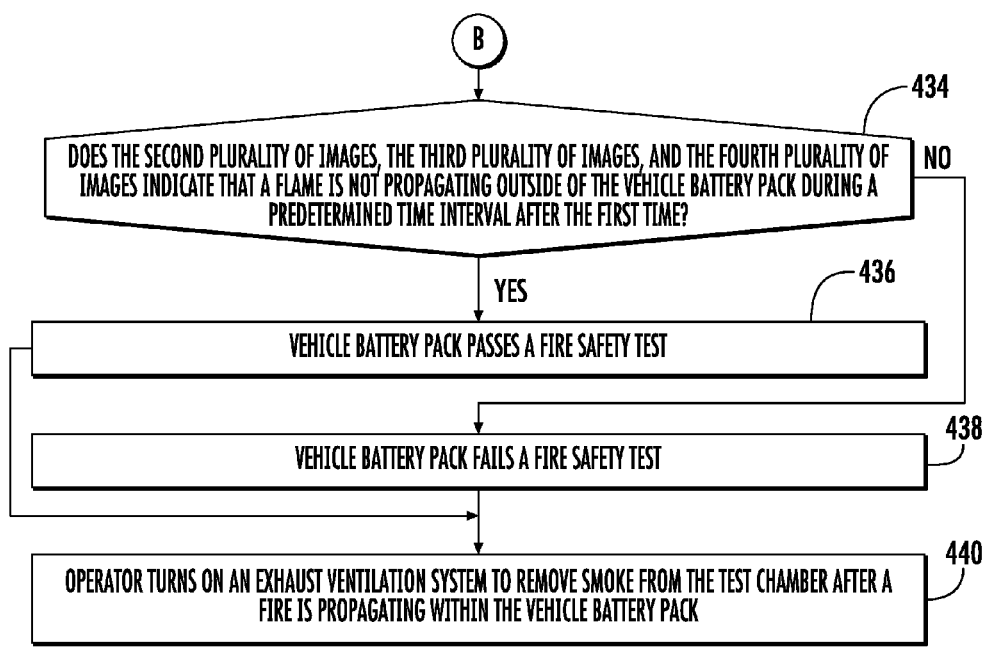

Referring to FIG. 1, a battery pack test system 10 for performing a fire safety test associated with a vehicle battery pack 20, in accordance with an exemplary embodiment is provided. During the fire safety test, the vehicle battery pack 20 is contained within a test chamber 30. An advantage of the battery pack test system 10 is that the test system 10 can accurately determine whether the vehicle battery pack 20 can contain an internal fire for a predetermined amount of time.

The vehicle battery pack 20 is configured to provide an operational voltage for powering either a hybrid electric vehicle or a pure electric vehicle. The vehicle battery pack 20 includes a housing 35, a battery module 40, and a battery module 50. The housing 35 is configured to hold the battery modules 40, 50 therein. In one exemplary embodiment, the battery modules 40, 50 are electrically coupled together in series with one another. For purposes of simplicity, only two battery modules 40, 50 are shown. However, in an alternative embodiment, a plurality of additional battery modules could be utilized within the vehicle battery pack 20.

The battery module 40 includes a housing 60, battery cells 70, 72, and temperature sensors 80, 82. The housing 60 is configured to hold the battery modules 70, 72, and the temperature sensor 80 therein. In one exemplary embodiment, the battery cells 70, 72 are electrically coupled in series to one another. The battery cell 70 has a positive terminal that is electrically coupled to the contactor 212. The battery cell 70 further includes a negative terminal coupled to a positive terminal of the battery cell 72. The battery cell 72 further includes a negative terminal electrically coupled to a positive terminal of a battery cell 172 in the battery module 50. In an exemplary embodiment, the battery cells 70, 72 are pouch-type lithium-ion battery cells having a substantially rectangular peripheral profile. Of course, in an alternative embodiment, other types of battery cells and/or alternative shaped battery cells (e.g., cylindrical shaped battery cells) could be utilized.

The temperature sensor 80 is disposed within the battery module 40. The temperature sensor 80 is configured to iteratively generate a temperature signal indicative a first temperature level within the battery module 40 that is received by the data acquisition computer 280. The data acquisition computer 280 is programmed to iteratively store the first temperature level over time in a memory device 282.

The temperature sensor 82 is disposed outside of the battery module 40 and inside of the housing 35 of the vehicle battery pack 20. The temperature sensor 82 is configured to iteratively generate a temperature signal indicative a second temperature level outside of the battery module 40 that is received by the data acquisition computer 280. The data acquisition computer 280 is further programmed to iteratively store the second temperature level over time in the memory device 282.

The electrically-actuated igniter 90 is disposed in the housing 35 of the vehicle battery pack 20 proximate to the housing 60 of the battery module 40. The igniter 90 is configured to generate an electrical spark in response to a received voltage to initiate a fire within the vehicle battery pack 20 when either an output voltage level of a battery cell 70 within the battery module 40 is greater than a threshold voltage level or gases are escaping from the battery module 40. In particular, the electrically-actuated igniter 90 is electrically coupled to a node 221. A switch 220 is electrically coupled between the node 221 and a voltage source 216. Also, a resistor 222 is electrically coupled between the node 221 and electrical ground. When the switch 220 has a closed operational state, a voltage from the voltage source 216 is applied to the igniter 90 to induce the igniter 90 to generate a spark. When the switch 220 has an open operational state, a voltage is not applied to the igniter 90.

The battery module 50 includes a housing 160, battery cells 170, 172, and temperature sensors 180, 182. The housing 160 is configured to hold the battery modules 170, 172, and the temperature sensor 180 therein. In one exemplary embodiment, the battery cells 170, 172 are electrically coupled in series to one another. The battery cell 172 has a positive terminal that is electrically coupled to the negative terminal of the battery cell 72. The battery cell 172 further includes a negative terminal coupled to a positive terminal of the battery cell 170. The battery cell 170 further includes a negative terminal electrically coupled to the contactor 210. In an exemplary embodiment, the battery cells 170, 172 are pouch-type lithium-ion battery cells having a substantially rectangular peripheral profile. Of course, in an alternative embodiment, other types of battery cells and/or alternative shaped battery cells (e.g., cylindrical shaped battery cells) could be utilized.

The temperature sensor 180 is disposed within the battery module 50. The temperature sensor 180 is configured to iteratively generate a temperature signal indicative a first temperature level within the battery module 50 that is received by the data acquisition computer 280. The data acquisition computer 280 is programmed to iteratively store the first temperature level over time in the memory device 282.

The temperature sensor 182 is disposed outside of the battery module 50 and inside of the housing 35 of the vehicle battery pack 20. The temperature sensor 182 is configured to iteratively generate a temperature signal indicative a second temperature level outside of the battery module 50 that is received by the data acquisition computer 280. The data acquisition computer 280 is further programmed to iteratively store the second temperature level over time in the memory device 282.

The battery pack test system 10 is configured to perform a fire safety test on the vehicle battery pack 20 disposed in the test chamber 30. The battery pack test system 10 includes battery pack charging devices 200, 204, contactors 210, 212, 214, 215, the electrically-actuated igniter 90, a voltage source 216, a switch 220, a resistor 222, video cameras 230, 235, 240, 250, a data acquisition computer 280, a master computer 282, and a display monitor 284.

The battery charging device 200 is configured to apply a first electrical current to the vehicle battery pack 20 when the contactors 210, 212 have a closed operational state. In an exemplary embodiment, the battery charging device 200 supplies a relatively constant electrical current to the vehicle battery pack 20 until the vehicle battery pack 20 has a state-of-charge substantially equal to a desired state-of-charge for testing purposes. In one exemplary embodiment, the desired state-of-charge is a 100% maximum state-of-charge. In other words, in one exemplary embodiment, the battery charging device 200 charges the vehicle battery pack 20 until vehicle battery pack 20 has an overcharged operational state.

The contactors 210, 212 are configured to selectively and electrically couple the battery charging device 200 to the vehicle battery pack 20. The contactor 210 is electrically coupled between the battery charging device 200 and the negative terminal of the battery cell 170 of the battery module 50. The contactor 212 is electrically coupled between the battery charging device 200 and the positive terminal of the battery cell 70 of the battery module 40. When the contactors 210, 212 receive respective control signals from the data acquisition computer 280, the contactors 210, 212 each transition from an open operational state to a closed operational state to electrically couple the battery charging device 200 to the vehicle battery pack 20. Also, when the contactors 210, 212 do not receive the respective control signals from the data acquisition computer 280, the contactors 210, 212 each transition from the closed operational state to the open operational state to electrically de-couple the battery charging device 200 from the vehicle battery pack 20.

The battery charging device 204 is configured to apply a second electrical current to the battery cell 70 of the vehicle battery pack 20 when the contactors 214 and 215 have a closed operational state, and the contactors 210, 212 have an open operational state. In an exemplary embodiment, the battery charging device 204 supplies a relatively constant second electrical current to the battery cell 70 such that a state-of-charge of the battery cell 70 is greater than a threshold state-of-charge, after the vehicle battery pack 20 has a state-of-charge substantially equal to a desired state-of-charge. In one exemplary embodiment, the threshold state-of-charge of the battery cell 70 is a 100% maximum state-of-charge. In other words, in one exemplary embodiment, the battery charging device 204 charges the battery cell 70 until battery cell 70 has an overcharged operational state.

The contactors 214, 215 are configured to selectively and electrically couple the battery charging device 204 to the battery cell 70. The contactor 214 is electrically coupled between the battery charging device 204 and the negative terminal of the battery cell 70. The contactor 215 is electrically coupled between the battery charging device 204 and the positive terminal of the battery cell 70. When the contactors 214, 215 receive respective control signals from the data acquisition computer 280, the contactors 214, 215 each transition from an open operational state to a closed operational state to electrically couple the battery charging device 204 to the battery cell 70. Also, when the contactors 214, 215 do not receive the respective control signals from the data acquisition computer 280, the contactors 214, 215 each transition from the closed operational state to the open operational state to electrically de-couple the battery charging device 204 from the battery cell 70.

The electrically-actuated igniter 90 is disposed within the vehicle battery pack 20 proximate to the battery module 40. The igniter 90 is configured to generate an electrical spark in response to a received voltage to initiate a fire within the vehicle battery pack 20. In one exemplary embodiment, the data acquisition computer 280 generates a control signal to induce the switch 220 to transition to a closed operational state when either an output voltage level of the battery cell 70 is greater than a threshold voltage level, or a first plurality of images from the video camera 250 indicate gases are escaping from the battery module 40 which further indicates gases are escaping from the battery cell 70. When the switch 220 has a closed operational state, a voltage from the voltage source 216 is applied to the igniter 90 and the igniter 90 generates a spark in response to the received voltage. After a predetermined amount of time, the data acquisition computer 280 stops generating the control signal to induce the switch 220 to transition to an open operational state. When the switch 220 has an open operational state, a voltage is not applied to the igniter 90 and the igniter 90 stops generating a spark. In an alternative embodiment, the switch 220 can be manually actuated by an operator between a closed operational state and an open operational state.

The video cameras 230, 235, 240 are positioned to obtain a 360° view of exterior of the housing 35 of the vehicle battery pack 20. The images generated by the video cameras 230, 235, 240 are utilized to determine whether a fire originating in within the vehicle battery pack 20 propagates outside of the vehicle battery pack 20 after a predetermined time interval associated with a fire safety test. In one exemplary embodiment, each of the images generated by the video cameras 230, 235, 240 have an associated timestamp for synchronizing the images with one another and for monitoring the time associated with the fire safety test. In one exemplary embodiment, the predetermined time interval for the fire safety test is in a range of 5-10 minutes. Of course, in an alternative embodiment, the predetermined time interval could be greater than 10 minutes.

The video camera 250 is utilized by an operator to determine when a fire is initiated within the battery module 40 by the igniter 90. The video camera 250 is disposed inside the housing 35 of the vehicle battery pack 20. The video camera 250 is configured to generate a first plurality of images of the exterior of the battery module 40 for at least a predetermined time interval. The video camera 250 operably communicates with the master computer 282 and transfers the first plurality of images to the master computer 282. The master computer 282 stores the first plurality of images in the memory device 285, and generates display signals to display the first plurality of images on the display monitor 284. Each image of the first plurality of images from the video camera 250 has a timestamp for synchronizing the respective image with the images from the other video cameras.

The video camera 230 is disposed outside of the test chamber 30 and proximate to a window 310. The window 310 extends through and is coupled to an outer wall 300 of the test chamber 30. The video camera 230 is configured to generate a second plurality of images of the exterior of the vehicle battery pack 20 for at least a predetermined time interval. The video camera 230 operably communicates with the master computer 282 and transfers the second plurality of images to the master computer 282. The master computer 282 stores the second plurality of images in the memory device 285, and generates display signals to display the second plurality of images on the display monitor 284. Each image of the second plurality of images from the video camera 230 has a timestamp for synchronizing the respective image with the images from the other video cameras.

The video camera 235 is disposed outside of the housing 35 of the vehicle battery pack 20 and inside the test chamber 30. The video camera 235 is configured to generate a third plurality of images of the exterior of the vehicle battery pack 20 for at least a predetermined time interval. The video camera 235 operably communicates with the master computer 282 and transfers the third plurality of images to the master computer 282. The master computer 282 stores the third plurality of images in the memory device 285, and generates display signals to display the third plurality of images on the display monitor 284. Each image of the third plurality of images from the video camera 235 has a timestamp for synchronizing the respective image with the images from the other video cameras.

The video camera 240 is disposed outside of the housing 35 of the vehicle battery pack 20 and inside the test chamber 30. The video camera 240 is configured to generate a fourth plurality of images of the exterior of the vehicle battery pack 20 for at least a predetermined time interval. The video camera 240 operably communicates with the master computer 282 and transfers the fourth plurality of images to the master computer 282. The master computer 282 stores the fourth plurality of images in the memory device 285, and generates display signals to display the fourth plurality of images on the display monitor 284. Each image of the fourth plurality of images from the video camera 240 has a timestamp for synchronizing the respective image with the images from the other video cameras.

During the fire safety test, an operator viewing the first plurality of images from the video camera 250 can determine when a fire is initiated within the vehicle battery pack 20 by the igniter 90 by viewing gases propagating from the battery module 40 and the associated timestamp of that image. The operator can further determine whether a fire propagates outside the vehicle battery pack 20 within a predetermined time interval by viewing the images from the video cameras 230, 235, 240 and the associated timestamps of these images.

The data acquisition computer 280 is operably coupled to the temperature sensors 80, 82, 180, 182, the battery charging devices 200, 204, the contactors 210, 212, 214, 215, the switch 220, the video cameras 230, 235, 240, 250, and the master computer 282. In one exemplary embodiment, the data acquisition computer 280 is programmed to perform at least a portion of the steps of a fire safety test as will be explained in greater detail below. The data acquisition computer 280 includes a memory device 282 for storing programmed instructions and data associated with the fire safety test.

The master computer 282 is operably coupled to the video cameras 230, 235, 240, 250, the data acquisition computer 280, and the display monitor 284. The master computer 282 is programmed to store the first, second, third, and fourth plurality of images from the video cameras 250, 230, 235, 240, respectively in the memory device 285. The master computer 282 is further configured to generate display signals to display the first, second, third, and fourth plurality of images on the display monitor 284.

The test chamber 30 is configured to hold the vehicle battery pack 20 therein. The test chamber 30 includes an outer wall 300 having the window 310 disposed therethrough. The test chamber 30 further includes an exhaust ventilation system 320 for removing smoke from an interior region of the test chamber 30 during a fire safety test.

Referring to FIGS. 1-4, a flowchart of a method for performing a fire safety test associated with the vehicle battery pack 20 utilizing the battery pack test system 10, in accordance with another exemplary embodiment will be explained.

At step 400, the video camera 250 disposed within the housing 35 of the vehicle battery pack 20 generates a first plurality of images of the interior of the vehicle battery pack 20. The master computer 282 receives the first plurality of images and stores the first plurality of images in the memory device 285.

At step 402, the video camera 250 disposed proximate to the window 310 of the test chamber 30 generates a second plurality of video images of an exterior of the vehicle battery pack 20 disposed in the test chamber 30. The master computer 282 receives the second plurality of images and stores the second plurality of images in the memory device 285.

At step 404, the video cameras 235, 240 disposed in the test chamber 30 and outside of the vehicle battery pack 20 generate a third plurality of video images and a fourth plurality of video images, respectively, of the exterior of the vehicle battery pack 20. The master computer 282 receives the third and fourth plurality of images and stores the third and fourth plurality of images in the memory device 285.

At step 406, the temperature sensor 80 iteratively generates a first temperature signal indicative a first temperature level within the battery module 40 in the vehicle battery pack 20 that is received by the data acquisition computer 280 and stored in the memory device 282 by the data acquisition computer 280.

At step 408, the temperature sensor 82 iteratively generates a second temperature signal indicative a second temperature level outside of the battery module 40 and inside the vehicle battery pack 20 that is received by the data acquisition computer 280 and stored in the memory device 282 by the data acquisition computer 280.

At step 410, the data acquisition computer 280 generates first and second control signals to induce the contactors 210, 212, respectively, to each transition to a closed operational state to electrically couple the battery charging device 200 to the vehicle battery pack 20.

At step 418, the battery charging device 200 supplies a relatively constant first electrical current to the vehicle battery pack 20 until the vehicle battery pack 20 as a state-of-charge substantially equal to a desired state-of-charge.

At step 420, the data acquisition computer 280 stops generating the first and second control signals to induce the contactors 210, 212, respectively, to each transition to an open operational state to electrically de-couple the battery charging device 200 from the vehicle battery pack 20.

At step 422, the data acquisition computer 280 generates third and fourth control signals to induce contactors 214, 215, respectively, to each transition to a closed operational state to electrically couple the battery charging device 204 to the battery cell 70 within the vehicle battery pack 20.

At step 424, the battery charging device 204 supplies a second electrical current to the battery cell 70 in the vehicle battery pack 20 until a state-of-charge of the battery cell 70 is greater than a threshold state-of-charge, after the vehicle battery pack 20 has the state-of-charge substantially equal to the desired state-of-charge.

At step 426, the data acquisition computer 280 makes a determination as to whether either the output voltage level of the battery cell 70 is greater than a threshold voltage level or the first plurality of images indicate gases escaping from the battery cell 70. If the value of step 426 equals "yes", the method advances to step 428. Otherwise, the method returns to step 426. In an alternative embodiment, an operator manually performs the step 426.

At step 428, the data acquisition computer 280 starts iteratively generating a fifth control signal at a first time to induce the switch 220 that is electrically coupled between the electrically-actuated igniter 90 and the voltage source 216 to transition to a closed operational state such that an operational voltage is applied to the igniter 90 in the vehicle battery pack 20 to induce the igniter 90 to generate an electrical spark to generate a fire within the vehicle battery pack 20. In an alternative embodiment, an operator performs the step 422 and manually transitions the switch 220 to a closed operational state to induce the igniter 90 to generate electrical spark to generate a fire within the interior region of the housing 35 of the vehicle battery pack 20.

At step 434, an operator makes a determination is to whether the second plurality of video images, the third plurality of video images, and the fourth plurality of images indicate that a flame is not propagating outside of the vehicle battery pack 20 during a predetermined time interval after the first time when the fire was initiated within the vehicle battery pack 20. If the value of step 434 equals "yes", the method advances to step 436. Otherwise, the method advances to step 438.

At step 436, the operator determines that the vehicle battery pack 20 passes the fire safety test. After step 436, the method advances to step 440.

Referring again to step 434, if the value of step 434 equals "no", the method advances to step 438. At step 438, the operator determines that the vehicle battery pack 20 has failed the fire safety test. After step 438, the method advances to step 440.

At step 440, the operator turns on the exhaust ventilation system 320 to remove smoke from the test chamber 30 after a fire is propagating within the vehicle battery pack 20.

Referring to FIG. 1, in an alternative embodiment, the battery charging device 204 and the contactors 214, 215 can be removed from the battery pack test system 10, and the contactors 216, 217 can be utilized to selectively electrically couple the battery charging device 200 to the battery cell 70. The data acquisition computer 280 is configured to generate control signals to transition the contactors 216, 217 from an open operational state to a closed operational state. Further, the data acquisition computer 280 is configured to stop generating control signals to transition the contactors 216, 217 from the closed operational state to the open operational state. In this alternative embodiment, the battery charging device 240 is utilized to further charge the battery cell 72 to a state-of-charge that is greater than a threshold state-of-charge, after the vehicle battery pack 20 has the state-of-charge substantially equal to a desired state-of-charge.

The battery test system 10 and the method for performing the fire safety test provide a substantial advantage over other battery test systems. In particular, the battery test system 10 provides a technical effect of utilizing a battery charging device to charge the vehicle battery pack to a desired state-of-charge, and a second battery charger to further charge a battery cell within the vehicle battery pack to greater than a threshold state-of-charge, and an electrically-actuated igniter to induce a fire within an interior region of the vehicle battery pack, and a video camera to determine whether a flame propagates outside of the vehicle battery pack within a predetermined time interval.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:
1. A battery pack test system for testing a vehicle battery pack, comprising:
a first battery charging device configured to supply a first electrical current to the vehicle battery pack until the vehicle battery pack has a state-of-charge substantially equal to a desired state-of-charge;

a second battery charging device configured to supply a second electrical current to a battery cell in the vehicle battery pack such that a state-of-charge of the battery cell is greater than a threshold state-of-charge, after the vehicle battery pack has the state-of-charge substantially equal to a desired state-of-charge;

a data acquisition computer configured to measure an output voltage level of the battery cell;

an electrically-actuated igniter disposed in the vehicle battery pack;

a switch electrically coupled between the electrically-actuated igniter and a voltage source, the switch having a closed operational state in which a voltage is applied to the electrically-actuated igniter to induce the igniter to generate an electrical spark, the switch further having an open operational state;

a first video camera configured to generate a first plurality of images of an interior of the vehicle battery pack; and the switch being transitioned from the open operational state to the closed operational state at a first time if either the output voltage level of the battery cell is greater than a threshold voltage level or the first plurality of images indicate gases escaping from the battery cell, to induce the igniter to generate the electrical spark to generate a fire within an interior region of the vehicle battery pack.

2. The battery pack test system of claim 1, further comprising:

a second video camera configured to generate a second plurality of images of a first portion of an exterior of the vehicle battery pack;

a third video camera configured to generate a third plurality of images of a second portion of the exterior of the vehicle battery pack; and a fourth video camera configured to generate a fourth plurality of images of a third portion of the exterior of the vehicle battery pack.

3. The battery pack test system of claim 2, wherein the second, third, and fourth video cameras provide 360 degree video monitoring of the exterior of the vehicle battery pack.

4. The battery pack test system of claim 2, wherein the vehicle battery pack passes a fire safety test if none of the second, third, and fourth plurality of images indicate a flame propagating outside of the vehicle battery pack during a predetermined time interval.

5. The battery pack test system of claim 4, wherein the predetermined time interval is in a range of 5-10 minutes.

6. The battery pack test system of claim 2, further comprising a master computer that is operably coupled to the first, second, third, and fourth video cameras, the master computer configured to store the first, second, third, and fourth plurality of images in a memory device.

7. The battery pack test system of claim 1, wherein the electrically-actuated igniter is disposed within the vehicle battery pack and proximate to a battery module having the battery cell therein.

8. The battery pack test system of claim 1, wherein the data acquisition computer is operably coupled to the switch, the data acquisition computer programmed to generate a first control signal to induce the switch to transition from the open operational state to the closed operational state at the first time if the output voltage level of the battery cell is greater than the threshold voltage level.

9. The battery pack test system of claim 1, further comprising a first temperature sensor operably coupled to the data acquisition computer, the first temperature sensor disposed within a battery module of the vehicle battery pack, the first temperature sensor configured to iteratively generate a first temperature signal indicative a first temperature level within the battery module that is received by the data acquisition computer, the data acquisition computer programmed to iteratively store the first temperature level over time in a memory device.

10. The battery pack test system of claim 9, further comprising a second temperature sensor disposed outside of the battery module and inside of the vehicle battery pack, the second temperature sensor configured to iteratively generate a second temperature signal indicative a second temperature level outside of the battery module that is received by the data acquisition computer, the data acquisition computer further programmed to iteratively store the second temperature level over time in the memory device.

11. The battery pack test system of claim 1, further comprising a test chamber configured to hold the vehicle battery pack therein.

12. The battery pack test system of claim 11, wherein the test chamber has a window disposed thereon, a second video camera being disposed outside of the test chamber and proximate to the window.

13. A battery pack test system for testing a vehicle battery pack, comprising:

a first battery charging device configured to supply a first electrical current to the vehicle battery pack until the vehicle battery pack has a state-of-charge substantially equal to a desired state-of-charge;

the first battery charging device further configured to supply a second electrical current to a battery cell in the vehicle battery pack such that a state-of-charge of the battery cell is greater than a threshold state-of-charge, after supplying the first electrical current to the battery pack;

a data acquisition computer configured to measure an output voltage level of the battery cell;

an electrically-actuated igniter disposed in the vehicle battery pack;

a switch electrically coupled between the electrically-actuated igniter and a voltage source, the switch having a closed operational state in which a voltage is applied to the electrically-actuated igniter to induce the igniter to generate an electrical spark, the switch further having an open operational state;

a first video camera configured to generate a first plurality of images of an interior of the vehicle battery pack; and the switch being transitioned from the open operational state to the closed operational state at a first time if either the output voltage level of the battery cell is greater than a threshold voltage level or the first plurality of images indicate gases escaping from the battery cell, to induce the igniter to generate the electrical spark to generate a fire within an interior region of the battery pack.

14. The battery pack test system of claim 13, further comprising:

a second video camera configured to generate a second plurality of images of a first portion of an exterior of the vehicle battery pack;

a third video camera configured to generate a third plurality of images of a second portion of the exterior of the vehicle battery pack; and a fourth video camera configured to generate a fourth plurality of images of a third portion of the exterior of the vehicle battery pack.

15. The battery pack test system of claim 14, wherein the second, third, and fourth video cameras provide 360 degree video monitoring of the exterior of the vehicle battery pack.

16. The battery pack test system of claim 14, wherein the vehicle battery pack passes a fire safety test if none of the second, third, and fourth plurality of images indicate a flame propagating outside of the vehicle battery pack during a predetermined time interval.

17. The battery pack test system of claim 16, wherein the predetermined time interval is in a range of 5-10 minutes.

* * * * *